United States Patent
Fischer

(10) Patent No.: US 10,122,527 B1
(45) Date of Patent: Nov. 6, 2018

(54) SIGNAL PHASE TRACKING WITH HIGH RESOLUTION, WIDE BANDWIDTH AND LOW PHASE NOISE USING COMPOUND PHASE LOCKED LOOP

(71) Applicant: NORTHROP GRUMMAN SYSTEMS CORPORATION, Falls Church, VA (US)

(72) Inventor: Gerald R. Fischer, Luray, VA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/934,890

(22) Filed: Mar. 23, 2018

(51) Int. Cl.
| | |
|---|---|
| H04L 7/033 | (2006.01) |
| H03L 7/08 | (2006.01) |
| H03L 7/099 | (2006.01) |
| H03L 7/085 | (2006.01) |
| H03M 3/00 | (2006.01) |

(52) U.S. Cl.
CPC ............ H04L 7/0331 (2013.01); H03L 7/085 (2013.01); H03L 7/0807 (2013.01); H03L 7/0994 (2013.01); H03M 3/30 (2013.01)

(58) Field of Classification Search
CPC . H03L 7/081; H03L 7/087; H03L 7/18; H03L 7/07; H03L 7/0805; H03L 7/0807; H03L 7/085; H04L 7/0331; H03M 3/30
See application file for complete search history.

(56) References Cited

U.S. PATENT DOCUMENTS

| | | | |
|---|---|---|---|
| 4,763,129 A | 8/1988 | Perrotta | |
| 4,802,009 A | 1/1989 | Hartmeier | |
| 6,211,747 B1 * | 4/2001 | Trichet | H03C 3/0925 332/128 |
| 6,515,553 B1 * | 2/2003 | Filiol | H03C 3/0925 332/127 |
| 7,015,738 B1 * | 3/2006 | Cao | H03C 3/0925 327/156 |
| 8,958,513 B1 * | 2/2015 | Novellini | H04L 7/0337 375/355 |
| 9,306,730 B1 * | 4/2016 | Shu | H03L 7/1974 |

(Continued)

OTHER PUBLICATIONS

Terada, Jun, Nishimura, Kazuyoshi, Kimura, Shunji, Katsurai, Hiroaki, Yoshimoto, Naoto, Ohtomo, Yusuke: "A 10.3 Gb/s Burst-Mode CDR Using a ΔΣ DAC", IEEE Journal of Solid-State Circuits, vol. 43, No. 12, Dec. 2008; pp. 2921-2928.

(Continued)

*Primary Examiner* — Aristocratis Fotakis
(74) *Attorney, Agent, or Firm* — John A. Miller; Shumaker, Loop & Kendrick, LLP

(57) ABSTRACT

A clock recovery circuit for providing clock recovery from a burst signal that is periodically present and absent in a noisy channel. The recovery circuit includes an outer main tracking second-order phase locked loop (PLL) having an analog phase detector, a digital loop filter, and an analog/digital hybrid numerically controlled oscillator (NCO) that operates so that the clock recovery frequency is "frozen" to its last value from the previous burst and the phase detector is disabled during the gaps between data bursts. The NCO is implemented with an inner loop PLL that operates as a high resolution synthesizer having a low internal control bandwidth that preserves VCO phase noise. The outer main loop achieves a higher control bandwidth through direct tuning of the inner loop VCO with the outer loop tuning signal.

16 Claims, 2 Drawing Sheets

(56) References Cited

U.S. PATENT DOCUMENTS

| | | | | |
|---|---|---|---|---|
| 2002/0121938 A1* | 9/2002 | Fan | ............. | H03K 23/68 |
| | | | | 331/16 |
| 2005/0285688 A1* | 12/2005 | Hirano | ............. | H03C 3/0925 |
| | | | | 331/16 |
| 2006/0078079 A1* | 4/2006 | Lu | ............. | H03L 7/087 |
| | | | | 375/376 |
| 2009/0102564 A1* | 4/2009 | Ballantyne | ............. | H03C 3/08 |
| | | | | 331/10 |
| 2012/0068744 A1* | 3/2012 | Chang | ............. | H03L 7/23 |
| | | | | 327/157 |

OTHER PUBLICATIONS

Lund, Gavin; "A Noise-Gated PLL for Clock Recovery in a Free-Space Laser Communication System"; Massachusetts Institute of Technology 2012.

Rao, H.G., Browne, C.A., Caplan, D.O., Carney, J.J., Chavez, M.L., Fletcher, A.S., Fitzgerald, J.J., Kaminsky, R.D., Lund, G., Hamilton, S.A., Magliocco, R.J., Mikulina, O.V., Murphy, R.J., Seaver, M.M., Scheinbart, M.S., Spellmeyer, N.W., Wang, J.P.; "Electronics Design of a Multi-Rate DPSK Modem for Free-Space Optical Communications"; http://spiedigitallibrary.org/; Free-Space Laser Communication and Atmospheric Propagation XXVI, edited by Hamid Hemmati, Don M. Boroson, Proc. of SPIE vol. 8971, 89710Y-0277-786X/14, 2014.

Spellmeyer, Neal W., Burton, Clement D., Caplan, David O., Fitzgerald, John J., Hamilton, Scott A., Kaminsky, Richard D., Kaufmann, John E., Lund, Gavin, Mikulina, Olga V., Murphy, Robert J., Rao, Hemonth G., Ulmer, Todd G., Wang, Jade P.; "Sensitive Clock Recovery for Multi-Rate DPSK Optical Receivers"; 2015 IEEE International Conference on Space Optical Systems and Applications (ICSOS); 978-1-5090-0281-8/15.

* cited by examiner

SIGNAL PHASE TRACKING WITH HIGH RESOLUTION, WIDE BANDWIDTH AND LOW PHASE NOISE USING COMPOUND PHASE LOCKED LOOP

BACKGROUND

Field

This disclosure relates generally to a clock recovery circuit for providing clock recovery from a digital signal and, more particularly, to a clock recovery circuit for providing clock recovery from a digital burst signal that is periodically present and absent in a noisy channel, where the circuit includes an outer main tracking phase locked loop (PLL) having an analog phase detector, a digital loop filter and an analog/digital hybrid numerically controlled oscillator (NCO), where the NCO includes an inner loop PLL operating as a frequency synthesizer.

Discussion

Data and communications messages sent between various devices and systems using wireless links, such as cellular signals, satellite uplink and downlink signals, satellite cross-link signals, etc., consist of a stream of data bits or symbols that are modulated onto a carrier signal. When the signal is received by a receiver, a demodulation and detection process is employed to recover the stream of bits or symbols from the carrier signal, which requires knowledge of the time position of the individual bits or symbols in the signal to correctly determine the value of each bit or symbol, and thus recover the information. The process of determining the time position of the bits or symbols is often called clock recovery.

Some communications systems, such as certain wired links, operate with sufficiently noise free channels, so that clock recovery can be performed by direct examination of the received signal on a symbol-by-symbol or bit-by-bit basis using, for example, an individual transition from one symbol state to another as a true indicator of timing. A more difficult clock recovery problem occurs in a communications system in which the channel, wireless or wired, is too noisy for the direct symbol-by-symbol recovery method due to extraneous transitions caused by the noise. Data and communications messages are sometimes transmitted in a burst format in which the signal is not continuously transmitted, i.e., the signal is periodically present and absent, where it is difficult to provide clock recovery that is able to reliably maintain clock timing during the gaps between signal bursts without drift or random deviation due to circuit imperfections. Clock recovery is even more difficult in a system where the arriving signal burst may come from a source that is not correlated, or not sufficiently correlated, in frequency or phase with prior bursts. In this case, the signal burst usually includes preamble bits or symbols at the beginning of the burst that are used for clock recovery acquisition purposes and do not include information, where the number of preamble clock recovery bits is generally minimized as much as possible to reduce the time that information is not being transmitted.

A common method of performing clock recovery in a noisy bursty channel is to lock a controlled local oscillator to the signal using a phase locked loop (PLL) and then using the oscillator as the bit or symbol timing reference clock. The burst format presents challenges for the PLL particularly in the area of the oscillator. The PLL must provide accurate bit timing as quickly as possible when a burst arrives to minimize the number of lost bits. The PLL requires a controlled oscillator with excellent performance in several conflicting areas such as precision, tuning range, tuning modulation bandwidth and low phase noise. An ideal controlled oscillator would remain fixed in frequency and phase in between the bursts, yet have a wide tuning range and wide modulation bandwidth to allow acquisition and tracking of the signal during the burst.

Known microwave oscillators have low intrinsic noise but too much drift, whereas digital oscillators have low drift but require considerably more size, weight, power and cost to produce very high frequencies with sufficient resolution. A microwave oscillator can be augmented with a local PLL, but the local PLL embedded within the clock recovery PLL must have an undesirably wide control system bandwidth to allow the main PLL to respond to the signal with adequate control system stability, resulting in phase noise degradation of the microwave oscillator due to noise sources internal to the local PLL, such as the phase detector.

DETAILED DESCRIPTION OF THE EMBODIMENTS

The following discussion of the embodiments of the disclosure directed to a clock recovery circuit for providing clock recovery in a receiver that receives a burst signal using an outer main tracking phase locked loop (PLL) having a digital loop filter and an analog/digital hybrid numerically controlled oscillator (NCO), where the NCO includes an inner PLL is merely exemplary in nature, and is in no way intended to limit the disclosure or its applications or uses.

Figure 1:
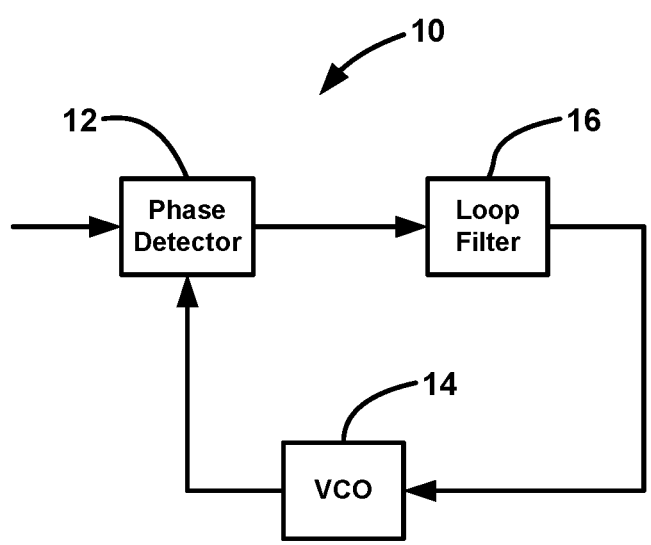
FIG. 1 is a block diagram of a known PLL.

FIG. 1 is a simple block diagram of a known PLL 10 of the type that may be employed in a clock recovery circuit in a receiver. The PLL 10 includes a phase detector 12 that receives an input signal, which is a serial stream of bits or symbols. The phase detector 12 also receives a stable frequency signal from a voltage controlled oscillator (VCO) 14 and compares the phase of the VCO signal with the phase of the bit or symbol signal and provides an error voltage signal that represents the difference in phase between the signals. The error voltage signal from the phase detector 12 is provided to a loop filter 16 that filters out high frequency noise signals that could affect the phase and frequency stability of the VCO 14 and provides the desired control system characteristics for maintaining PLL performance and stability. The filtered error signal is then provided to the VCO 14 as a control signal to change the frequency of the VCO 14 to drive the error voltage from the phase detector 12 to zero so that the VCO signal is in phase with the bit or symbol signal. The frequency signal from the VCO 14 that is controlled in this manner provides the recovered clock from the bit or symbol signal for use in detection of the bits or symbols.

This type of PLL is well known in the art, but has a number of drawbacks for clock recovery in a communications system operating in a burst format. These drawbacks include the initial tuning inaccuracy of the VCO 14 and the phase and frequency drift of the VCO 14 signal during the gaps between signal bursts. As will be discussed, the present disclosure describes a clock recovery circuit for recovering a symbol or bit clock in a receiver that receives data bursts, where the signal is periodically present and absent and the channel is sufficiently noisy so that detection of the signal timing by direct inspection on a symbol-by-symbol or bit-by-bit basis is unreliable, where the system has application when the arriving burst is known to be substantially correlated with a prior burst. The circuit includes a second-order PLL having an analog phase detector, a digital loop filter and a digital/analog hybrid VCO that operate so that the clock recovery frequency is "frozen" to its last value from the previous burst and the phase detector is disabled during the gaps between data bursts. By operating the phase detector only during the presence of the signal bursts and by controlling the phase and frequency of the hybrid VCO during the gaps, excessive phase creep and random walk during the gaps can be eliminated and the recovered clock will have accurate timing at the beginning of each burst.

Figure 2:
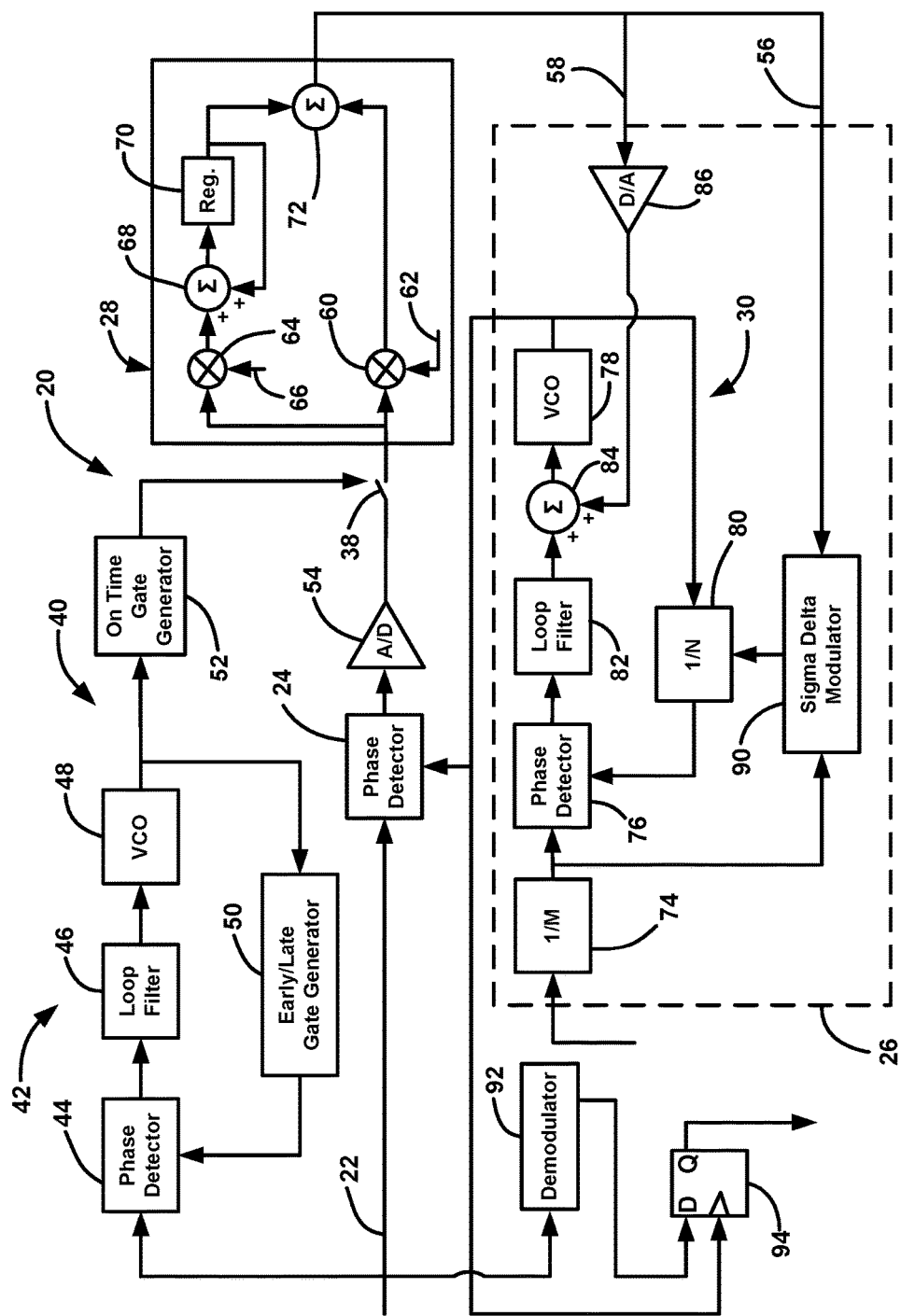
FIG. 2 is a schematic block diagram of a clock recovery circuit including an outer main tracking PLL having a digital loop filter and an analog/digital hybrid numerical control oscillator (NCO), where the NCO includes an inner PLL operating as a fractional N synthesizer.

FIG. 2 is a schematic block diagram of a clock recovery circuit 20 that would be part of a digital receiver, where the circuit 20 operates generally as a PLL. The circuit 20 includes a phase detector 24 that receives an analog carrier signal on which is modulated a stream of digital bits or symbols on line 22 in a burst format, a clock recovery numerically controlled oscillator (NCO) 26 that provides a stable analog frequency signal to the phase detector 24 for phase comparison with the bit or symbol signal, and a loop filter 28 that receives and filters the error signal from the phase detector 24 before sending it to the NCO 26 to make phase corrections and provide the clock recovery signal. As will be discussed below, the combination of the phase detector 24, the loop filter 28 and the NCO 26 operate as an outer main tracking PLL of the circuit 20. The phase detector 24 is an analog device that is necessary for high frequency signals, the loop filter 28 is a digital filter and the NCO 26 is an analog/digital hybrid device that receives digital tuning signals from the loop filter 28 that allows the frequency of the clock recovery signal that was previously obtained to be maintained or "frozen" during the gaps between signal bursts. An inner loop PLL 30 is provided within the NCO 26 and operates as a fractional N frequency synthesizer having a low bandwidth that limits the addition of phase detector and other circuit noise to the intrinsic VCO phase noise.

The circuit 20 includes a burst detector 40 that detects the timing of the burst of input bits or symbols on the line 22 based on relatively higher voltage or power of the signal plus noise during the burst compared to the background noise during the gap, and closes a switch 38 in response to identifying a burst so as to remove channel noise in the circuit 20 when no burst signal is present that acts to reduce the drift of the NCO 26 during the gaps. Because the switch 38 is downstream of the phase detector 24 any channel noise or other bias voltages from the detector 24 also do not influence the stability of the NCO 26 when the signal bursts are not present.

The burst detector 40 can be any burst detector suitable for the purposes discussed herein. In this non-limiting example, the burst detector 40 includes a PLL 42 that detects and tracks a periodic series of bursts. The burst detector 40 may be considered a burst tracker in the following description because of the use of a PLL in this example. The PLL has a pulse phase detector 44 that receives the bit or symbol signal on the line 22 at one input and provides an error signal that is filtered by a loop filter 46. The filtered error signal adjusts the frequency of a VCO 48, which is originally tuned to the approximate frequency of the burst periodicity, to provide the controlled sequence of pulses indicating when the burst of bits or symbols is occurring. The pulse sequence from the VCO 48 is then sent to an early/late gate generator 50 in a feedback loop that provides the other input to the phase detector 44. The gate generator 50 provides two pulses, specifically early and late pulses, based on the pulses from the VCO 48 that are correlated with the bit or symbol signal received by the phase detector 44. The difference between the early correlation and the late correlation is used as the error signal from the phase detector 44 to cause the VCO 48 to be aligned with the bursts in a manner well understood by those skilled in the art. The pulses from the VCO 48 are provided to an on-time gate generator 52 that causes the switch 38 to be closed when the burst is present.

When the bit or symbol signal is detected by the burst detector 40 on the line 22 and the switch 38 is closed, the phase error signal from the phase detector 24 that has been converted to a digital signal by an analog-to-digital (N/D) converter 54 is provided to the loop filter 28 that generates a tuning value on lines 56 and 58. Particularly, the digital phase error signal from the A/D converter 54 is provided to a proportional multiplier 60 where it is multiplied by a proportional gain signal $K_p$ on line 62 to scale the digital error signal over a wide bandwidth, where a proportional signal is provided to a summer 72. Additionally, the digital phase error signal from the A/D converter 54 is provided to an integral multiplier 64 where it is multiplied by an integral gain signal $K_i$ provided on line 66 and the multiplied integral signal is summed with previous multiplied integral signals in a summer 68 that are stored in a register 70 as accumulated integral signals. The accumulated integral signals are also sent to the summer 72 to be added to the proportional signal to generate the digital tuning signal for the NCO 26.

A reference clock signal from, for example, a master oscillator (not shown) in the receiver is provided to a 1/M divider 74 in the NCO 26 that divides the reference clock signal to provide a slower reference clock signal, which is then provided to a phase detector 76 in the inner loop PLL 30. The phase detector 76 also receives a stable frequency signal from a VCO 78 in the inner loop PLL 30 that is first divided by a 1/N divider 80 and generates a phase error signal. The output frequency signal from the VCO 78 is the recovered clock signal. The phase error signal from the phase detector 76 is provided to a loop filter 82 in the inner loop PLL 30 that operates in the same manner as the loop filter 46. The filtered error signal is provided to a summer 84 that adds the filtered error signal to the digital tuning signal on the line 58 after it has been converted to an analog signal by a D/A converter 86, where the added signal controls the frequency of the VCO 78. The tuning signal on the line 58 directly changes the frequency of the VCO 78 to provide rapid response to changes in the frequency or phase of the bits or symbols on the line 22. In order to increase accuracy of the NCO 26 for slow or static tuning, the divided reference clock signal from the divider 74 is also provided to a digital sigma delta modulator 90 along with the digital tuning signal from the loop filter 28 on the line 56 so that the tuning signal causes the divider 80 to divide by an average number that can be a fraction of an integer to provide the fine tuning. In this manner the NCO 26 is a dual port NCO that has the effect of a single port NCO with simultaneous benefits of wide modulation bandwidth and digitally accurate fine resolution tuning without requiring an internally wide bandwidth control bandwidth.

In this non-limiting embodiment, the bit or symbol signal on the line 22 is also provided to a demodulator 92 that removes the carrier wave, if it is present, and provides the stream of bits or symbols to the data input of a latch 94. The clock recovery signal from the VCO 78 is provided to a clock input of the latch 94 so that the bits or symbols are output from the latch 94 at the recovered clock frequency. In alternate embodiments, it may be advantageous to provide the bit or symbol signal to the phase detector 24 and/or the burst tracker 40 after the signal has been demodulated by the demodulator 92.

It will be apparent to those skilled in the art that the subject invention can be used to track a variety of signals, including carriers and continuous signals, and that the NCO will provide the advantage of low phase noise combined with accurate tuning and wide control bandwidth whether as part of a tracking loop or as part of other applications. It will also be apparent to those skilled in the art that the loop filter in the outer loop may be implemented using analog technology, provided that an analog to digital converter is used to interface the analog loop filter with the digital divider control in the inner loop, that the outer loop may be of any appropriate order, such as first order or third order, and that the inner loop frequency synthesizer may be of integer type, rather than fractional-N, provided that the application not require the increased resolution of the fractional-N type.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A clock recovery circuit that recovers a timing signal from an input signal, said recovery circuit comprising:
   a main phase detector responsive to the input signal and a clock recovery signal and providing a phase error signal;
   a main loop filter responsive to the phase error signal and generating a tuning signal; and
   a numerically controlled oscillator (NCO) circuit responsive to a reference clock signal and the tuning signal, said NCO circuit including an inner phase locked loop (PLL) having an inner phase detector generating an inner error signal in response to the reference clock signal and a feedback clock recovery signal, a feedback divider responsive to the clock recovery signal that divides the clock recovery signal by a programmable value defined by the tuning signal to generate the feedback clock recovery signal, an NCO circuit loop filter that filters the inner error signal, an NCO circuit summer that adds the filtered inner error signal and the tuning signal and provides a summed signal, and an NCO circuit controlled oscillator that is tuned by the summed signal to generate the clock recovery signal.

2. The recovery circuit according to claim 1 wherein the NCO circuit further includes a modulator responsive to the reference clock signal and the tuning signal, said modulator generating the programmable value used to generate the feedback clock recovery signal in the feedback divider, where the programmable value can include average division ratios that can be a fraction of an integer.

3. The recovery circuit according to claim 2 wherein the modulator is a digital sigma delta modulator.

4. The recovery circuit according to claim 1 wherein the NCO circuit further includes a reference signal divider that divides the reference clock signal before it is provided to the inner phase detector.

5. The recovery circuit according to claim 1 wherein the recovery circuit receives the input signal in a burst format where the input signal is periodically present and absent, said recovery circuit further comprising:
   a burst detector responsive to the input signal and detecting when the input signal is being received by the recovery circuit; and
   a switch responsive to the phase error signal and being closed by the burst detector in response to detecting the presence of the input signal.

6. The recovery circuit according to claim 5 wherein the burst detector includes a burst detector PLL having a burst detector phase detector, a burst detector loop filter and a burst detector controlled oscillator.

7. The recovery circuit according to claim 5 wherein the main loop filter is implemented digitally and the switch enables the main loop filter to respond to the input signal only during the presence of the input signal.

8. The recovery circuit according to claim 7 further comprising an analog-to-digital (A/D) converter positioned upstream of the switch that converts the phase error signal to a digital phase error signal provided to the main loop filter.

9. The recovery circuit according to claim 1 wherein the main loop filter includes a first multiplier that multiplies the phase error signal by a proportional gain signal to generate a proportional phase error signal, a second multiplier that multiplies the phase error signal by an integral gain signal and an accumulator for accumulating the multiplied integral signal to generate an integral phase error signal, wherein the proportional phase error signal and the integral phase error signal are added in a loop filter summer to generate the tuning signal.

10. The recovery circuit according to claim 9 wherein the NCO circuit further includes a digital-to-analog (D/A) converter that converts the tuning signal to an analog signal before it is sent to the NCO circuit summer.

11. A clock recovery circuit that recovers a timing signal from a bursty input signal where the input signal is periodically present and absent, said recovery circuit comprising:
   a main phase detector responsive to the input signal and a clock recovery signal and providing a phase error signal;
   an analog-to-digital (A/D) converter responsive to the phase error signal from the phase detector and converting the phase error signal to a digital phase error signal;
   a burst detector responsive to the input signal and detecting when the input signal is being received by the recovery circuit;
   a switch responsive to the digital phase error signal and being closed by the burst detector in response to detecting the presence of the input signal;
   a digital main loop filter responsive to the digital phase error signal and generating a digital tuning signal; and
   a numerically controlled oscillator (NCO) circuit responsive to a reference clock signal and the digital tuning signal, said NCO circuit including an inner phase locked loop (PLL) having an inner phase detector generating an inner error signal in response to the reference clock signal and a feedback clock recovery signal, a feedback divider responsive to the clock recovery signal that divides the clock recovery signal by a programmable value defined by the tuning signal to generate the feedback clock recovery signal, an NCO circuit loop filter that filters the inner error signal, a digital-to-analog (D/A) converter that converts the digital tuning signal to an analog tuning signal, an NCO circuit summer that adds the filtered inner error signal and the analog tuning signal and provides a summed signal, and an NCO circuit controlled oscillator that is tuned by the summed signal so as to generate the clock recovery signal.

12. The recovery circuit according to claim 11 wherein the NCO circuit further includes a modulator responsive to the reference clock signal and the tuning signal, said modulator generating the programmable value used to generate the feedback clock recovery signal in the feedback divider, where the programmable value can include average division ratios that can be a fraction of an integer.

13. The recovery circuit according to claim 12 wherein the modulator is a digital sigma delta modulator.

14. The recovery circuit according to claim 11 wherein the NCO circuit further includes a reference signal divider that divides the reference clock signal before it is provided to the inner phase detector.

15. The recovery circuit according to claim 11 wherein the burst detector includes a burst detector PLL having a burst detector phase detector, a burst detector loop filter and a burst detector controlled oscillator.

16. The recovery circuit according to claim 11 wherein the main loop filter includes a first multiplier that multiplies the phase error signal by a proportional gain signal to generate a proportional phase error signal, a second multiplier that multiplies the phase error signal by an integral gain signal and an accumulator for accumulating the multiplied integral signal to generate an integral phase error signal, wherein the proportional phase error signal and the integral phase error signal are added in a loop filter summer to generate the tuning signal.

* * * * *